(12) United States Patent
Darr et al.

(10) Patent No.: US 9,265,164 B2
(45) Date of Patent: Feb. 16, 2016

(54) POWER DISTRIBUTION BOX

(71) Applicant: Lear Corporation, Southfield, MI (US)

(72) Inventors: Christopher J. Darr, Livonia, MI (US); Peter Kowtun, Plymouth, MI (US); Dennis Pajtas, Hartland, MI (US)

(73) Assignee: Lear Corporation, Southfield, MI (US)

( * ) Notice: Subject to any disclaimer, the term of this patent is extended or adjusted under 35 U.S.C. 154(b) by 171 days.

(21) Appl. No.: 13/937,880

(22) Filed: Jul. 9, 2013

(65) Prior Publication Data

US 2015/0016028 A1 Jan. 15, 2015

(51) Int. Cl.
| | |
|---|---|
| *H05K 5/00* | (2006.01) |
| *H02G 3/10* | (2006.01) |
| *H02G 3/08* | (2006.01) |
| *H01R 13/68* | (2011.01) |
| *H01R 13/66* | (2006.01) |
| *H02G 3/14* | (2006.01) |
| *H01R 13/696* | (2011.01) |
| *H05K 7/00* | (2006.01) |
| *H02B 1/26* | (2006.01) |
| *H02B 1/04* | (2006.01) |
| *H05K 1/14* | (2006.01) |
| *H01R 13/46* | (2006.01) |

(52) U.S. Cl.
CPC ............ *H05K 5/0047* (2013.01); *H01R 13/665* (2013.01); *H01R 13/68* (2013.01); *H01R 13/696* (2013.01); *H02G 3/08* (2013.01); *H02G 3/10* (2013.01); *H02G 3/14* (2013.01)

(58) Field of Classification Search
CPC ......... H02G 3/08; H02G 3/081; H02G 3/086; H02G 3/088; H02G 3/10; H02G 3/14; H01R 13/68; H01R 13/684; H01R 13/688; H01R 13/696; H01R 13/6658; H01R 13/665; H01R 9/2458; H05K 7/02; H05K 7/023; H05K 7/026; H05K 7/04; H05K 7/06; H05K 7/10; B60R 16/0238; B60R 16/027
USPC ......... 361/601, 622, 624, 626, 627, 628, 629, 361/630, 637, 638, 639, 640, 641, 642, 644, 361/646, 647, 648, 736, 752; 174/50, 58, 174/59, 60, 135, 520; 439/76.2, 949
See application file for complete search history.

(56) References Cited

U.S. PATENT DOCUMENTS

| | | | |
|---|---|---|---|
| 5,438,310 A | 8/1995 | Ikari | |
| 5,877,944 A * | 3/1999 | Onizuka | ................... 361/826 |
| 5,995,380 A * | 11/1999 | Maue et al. | ................... 361/826 |
| 6,396,380 B1 | 5/2002 | Girke et al. | |
| 7,104,845 B2 | 9/2006 | Higuchi et al. | |
| 2002/0061666 A1* | 5/2002 | Sato | ................... 439/76.2 |

* cited by examiner

*Primary Examiner* — Hoa C Nguyen
*Assistant Examiner* — Binh Tran
(74) *Attorney, Agent, or Firm* — Dykema Gossett PLLC

(57) ABSTRACT

An integrated power distribution box including an upper level assembly including a printed circuit board comprising at least one electrical component, a lower housing configured to receive at least a portion of the printed circuit board, an intermediate housing configured to be coupled with at least one fuse, a master fuse electrically coupled to the printed circuit board, a lower level assembly including at least one connector corresponding to at least one of the master fuse, the at least one electrical component, and the at least one fuse.

20 Claims, 5 Drawing Sheets

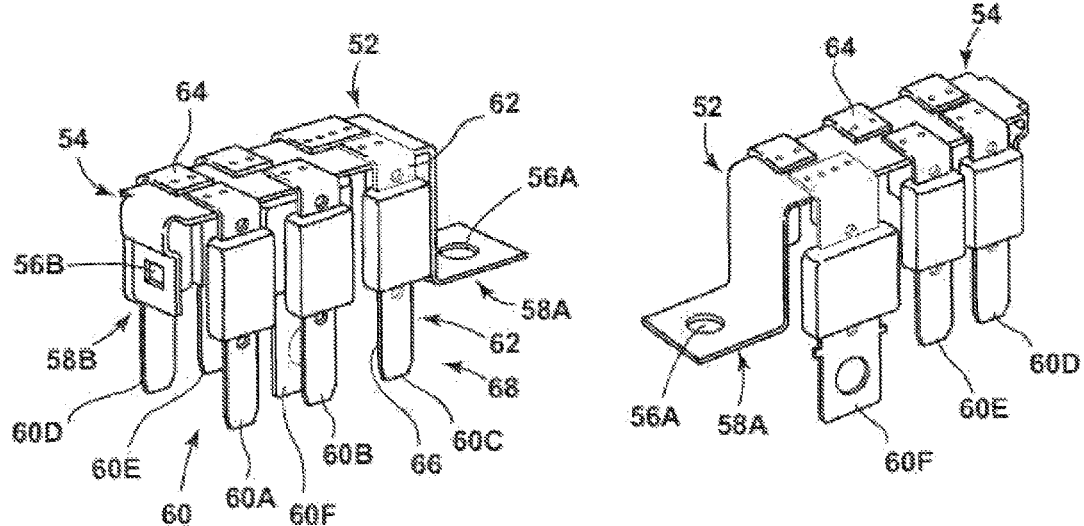
FIG. 3A  FIG. 3B
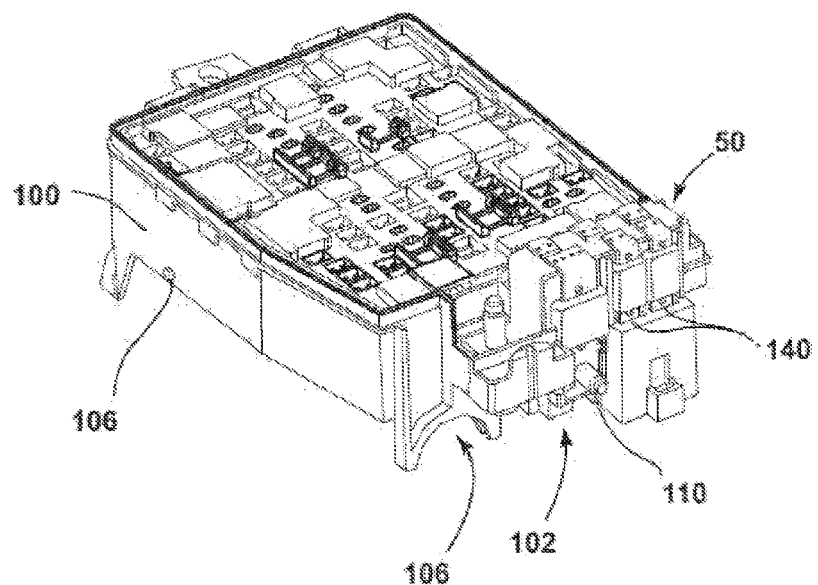
FIG. 4 ents 30, an intermediate housing 40, a master fuse 50, an electrical circuit 70, a lower housing 100, and one or more fasteners 110.

POWER DISTRIBUTION BOX

BACKGROUND

The present disclosure relates to power distribution boxes, including power distribution boxes that can be used to support a plurality of electrical components within a vehicle or the like.

SUMMARY

The present disclosure includes an integrated power distribution box including an upper level assembly including a printed circuit board comprising at least one electrical component, a lower housing configured to receive at least a portion of the printed circuit board, an intermediate housing configured to be coupled with at least one fuse, a master fuse electrically coupled to the printed circuit board, a lower level assembly including at least one connector corresponding to at least one of the master fuse, the at least one electrical component, and the at least one fuse.

Various aspects of this invention will become apparent to those skilled in the art from the following detailed description of the preferred embodiment, when read in light of the accompanying drawings.

BRIEF DESCRIPTION OF THE DRAWINGS

FIGS. 3A and 3B are perspective views of an embodiment of a master fuse in accordance with the teachings of the present disclosure.

FIG. 4 is a perspective view of a portion of an embodiment of an upper level assembly in accordance with the teachings of the present disclosure.

DETAILED DESCRIPTION

Reference will now be made in detail to embodiments of the present disclosure, examples of which are described herein and illustrated in the accompanying drawings. While the invention will be described in conjunction with embodiments, it will be understood that they are not intended to limit the invention to these embodiments. On the contrary, the invention is intended to cover alternatives, modifications and equivalents, which may be included within the spirit and scope of the invention as defined by appended claims.

Figure 1:
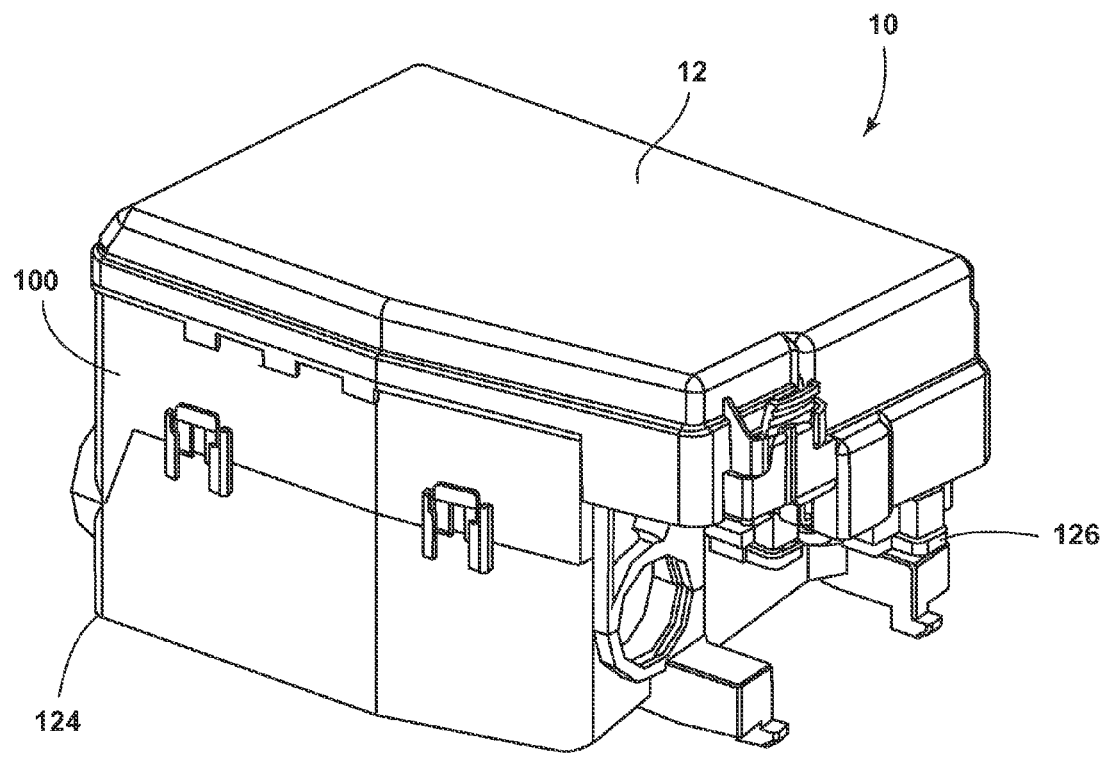
FIG. 1 is a perspective view of an embodiment of a power distribution box in accordance with the teachings of the present disclosure.

Referring to the drawings, FIG. 1 generally illustrates a power distribution box 10 in accordance with an embodiment of the present disclosure. The illustrated power distribution box 10 may be used to support a plurality of electrical components within a vehicle, as will be further explained below. It should be appreciated, however, that power distribution box 10 may be used in any appropriate environment and for any desired purpose.

Figure 2:
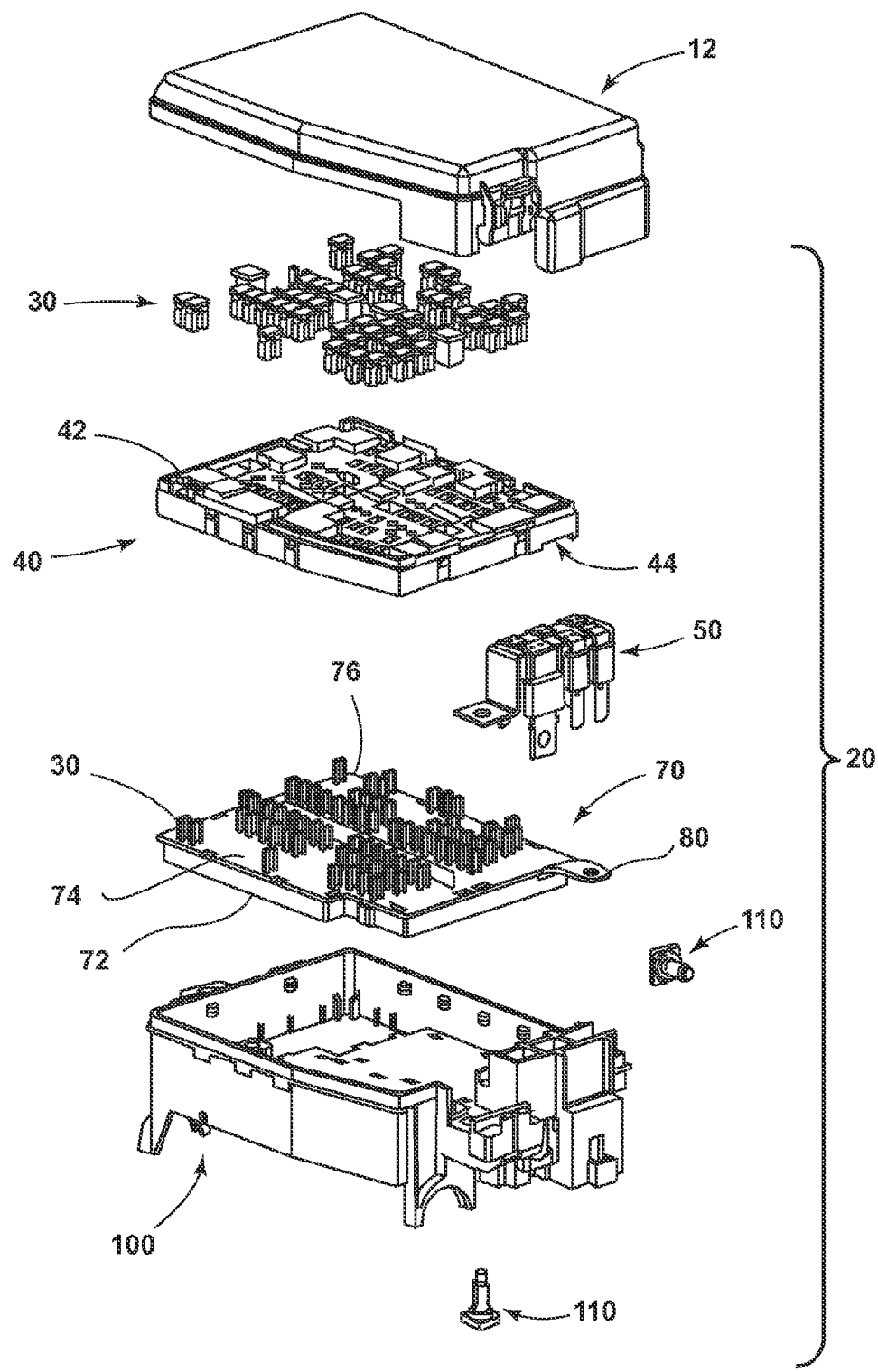
FIG. 2 is an exploded perspective view of an embodiment of a power distribution box in accordance with the teachings of the present disclosure.

Referring to FIG. 2, an embodiment of a power distribution box 10 may include an upper level assembly 20 and a cover 12. Upper level assembly 20 may include electrical components 30, an intermediate housing 40, a master fuse 50, an electrical circuit 70, a lower housing 100, and one or more fasteners 110.

In embodiments, power distribution box 10 may include at least one electrical circuit 70. Electrical circuit 70 may comprise a printed circuit board (PCB). Electrical circuit 70 may also comprise, without limitation, a printed wiring board, an etched wiring board, a printed circuit assembly, and/or a printed circuit board assembly. For simplicity, electrical circuit 70 may also be generally referred to herein as PCB 70, but embodiments of electrical circuit 70 are not so limited. Also, although a single electrical circuit and/or a single PCB may be described herein for simplicity, embodiments of a power distribution box 10 may comprise more than one electrical circuit and/or PCB.

PCB 70 may be configured to support and/or electrically connect electrical components 30. PCB 70 may comprise a plurality of electrically conducting, semiconducting, and/or insulating materials, including, without limitation, laminates, resins, polymers, and/or metals. PCB 70 may comprise a first side 72 that may be printed thereon and a second side 74 that may include electrical components 30 connected thereto. PCB 70 may also be printed on more than one side and/or have electrical components 60 connected to more than one side.

In embodiments, PCB 70 may be disposed in at least one of a plurality of locations. For example, and without limitation, PCB 70 may comprise a primary PCB 76 that may be disposed at least partially within lower housing 100 in some embodiments. Additionally or alternatively, PCB 70 may comprise a master fuse PCB 78 that may be disposed in proximity to master fuse 50.

In embodiments, PCB 70 may include a PCB bus bar 80 that may protrude from a surface of the PCB 70. PCB bus bar 80 may be configured to be connected or coupled with master fuse 50, for example, and without limitation, via a fastener 110 and/or via welding.

In embodiments, power distribution box 10 may include at least one electrical component 30. For example, and without limitation, electrical components may comprise fuses, relays, capacitors, resistors, transistors, operational amplifiers, diodes, sensors, terminals, connectors, fuses, relays, and/or any other desired electrical component. Although a single electrical component 30 may be described herein for simplicity, embodiments of a power distribution box 10 may comprise one or more of various electrical components, including those previously noted.

As generally illustrated in FIG. 2, embodiments of the upper level assembly 20 may include an intermediate housing 40. Intermediate housing 40 may include one or more intermediate housing features 42, that may include at least one recess, aperture, and/or protrusion. The at least one recess, aperture, and/or protrusion may be configured to receive at least a portion of at least one electrical component 30, such as, without limitation, a fuse and/or relay. Intermediate housing 40 may be configured to be coupled to PCB 70, and may be configured to receive at least a portion of the PCB 70. For example, and without limitation, intermediate housing 40 may include a recess 44 configured to connect to or receive at least a portion of PCB 70, for example, bus bar 80.

In embodiments, upper level assembly 20 may include a master fuse 50. As generally illustrated in FIGS. 3A and 3B, embodiments of master fuse 50 may include a master fuse bus bar 52 and at least one fuse. Master fuse bus bar 52 may at least partially comprise a conductive metal, such as, without limitation, copper. Master fuse bus bar 52 may be flexible. Master fuse bus bar 52 may include at least one curved portion 54. Master fuse bus bar 52 may include at least one aperture 56A. For example, as generally illustrated in FIGS. 3A and 3B, master fuse bus bar 52 may include a first aperture 56A and a second aperture 56B. First aperture 56A may be at or near a first end 58A, and second aperture 56B may be at or near a second end 58B. First and second apertures 56A and 56B may include several different shapes, sizes, and/or orientations. For example, and without limitation, first aperture 56A may be generally circular and second aperture 56B may be generally square and/or may be configured to receive at least a portion of a fastener 110. While master fuse bus bar 52 has been described herein as having first and second apertures 56A, 56B, master fuse bus bar 52 may be configured with one aperture, more than one aperture, or no apertures.

Master fuse bus bar first end 58A and second end 58B may include various shapes, sizes, and/or orientations. For example, and without limitation, first end 58A may be substantially horizontal (e.g., within 45°) and second end 58B may be substantially vertical (e.g., within 45°). With embodiments, first end 58A and/or second end 58B may be configured for a snapping or other interconnecting engagement with lower housing 100.

In embodiments, master fuse 50 may include one or more fuses, including one or more high current fuses 60 configured to facilitate or accommodate relatively high current capacities. For example, and without limitation, a high current fuse 60 may have a current capacity of at least twenty amps, or may have a current capacity of three hundred amps or even more. In embodiments, master fuse 50 may comprise a plurality of high current fuses 60A-60F, at least one of which may have a different current capacity than another high current fuse 60. For example, and without limitation, high current fuse 60F may have a current capacity of 300 amps or more, and high current fuse 60A may have a current capacity of 150 amps or more. In embodiments, a high current fuse 60 may be a blade-type fuse. In embodiments high current fuses 60 may include the same and/or different electrical characteristics, which may include blow characteristics. At least one of the high current fuses (e.g., high current fuse 60F) may be connected to or associated with a vehicle battery 16 and/or some other source of electrical energy.

High current fuses 60 may include one or more blade portions 66 that may be provided in various shapes, sizes, and/or orientations to accommodate an application. For example, and without limitation, a blade portion 66 may have a width of 8.0 mm or 9.5 mm. Blade portion 66 may include a substantially perpendicular portion 64 that may be coupled to master fuse bus bar 52. A blade portion 66 may extend downwardly and may be configured to be at least partially received by lower housing 100.

High current fuses 60 may be coupled to master fuse bus bar 52 in at least one of several ways, including, without limitation, welding, soldering, fastener(s), and/or toxing. Toxing may include a punch pressing a portion of the materials to be coupled (e.g., a portion of a high current fuse and/or a portion of master fuse bus bar 52) into a die cavity. A button-like coupling may be formed between the coupled materials. Toxing may, additionally or alternatively, include various joining techniques as commercialized by Tox Pressotechnik Gmbh & Co. Kg.

While embodiments of master fuse 50 may be described herein with more than one high current fuse 60, it should be understood that master fuse 50 may include a single fuse 60 or more than one fuse 60. It should also be understood that although blade-type fuses are discussed herein, other types of fuses and/or components with similar functionality may also be used.

As generally illustrated in FIG. 2, in embodiments, upper level assembly 20 may include a lower housing 100. As generally illustrated in FIGS. 3 and 4, in embodiments, lower housing 100 may be configured to at least partially receive PCB 70, intermediate housing 40, master fuse 50, and/or cover 12. For example, and without limitation, lower housing 100 may be configured to at least partially receive PCB bus bar 80. Lower housing 100 may, additionally or alternatively, be configured to be coupled to a high current fuse 60 of master fuse 50. For example, and without limitation, lower housing 100 may be configured to allow at least a portion of a high current fuse 60 coupled with a fastener 110 to slide into lower housing portion 102. Additionally or alternatively, lower housing 100 may include one or more apertures 104 configured to at least partially receive one or more high current fuses 60. For example, and without limitation, lower housing 100 may comprise a plurality of apertures 104 configured to receive downwardly extending blade portions 66 of at high current fuses 60.

Lower housing 100 may be configured to be coupled to a lower level assembly 120. For example, and without limitation, lower housing 100 may include one or more features 106, such as recesses, protrusions, and/or apertures, that may correspond to one or more features 124 of lower level assembly 120.

Figure 5:
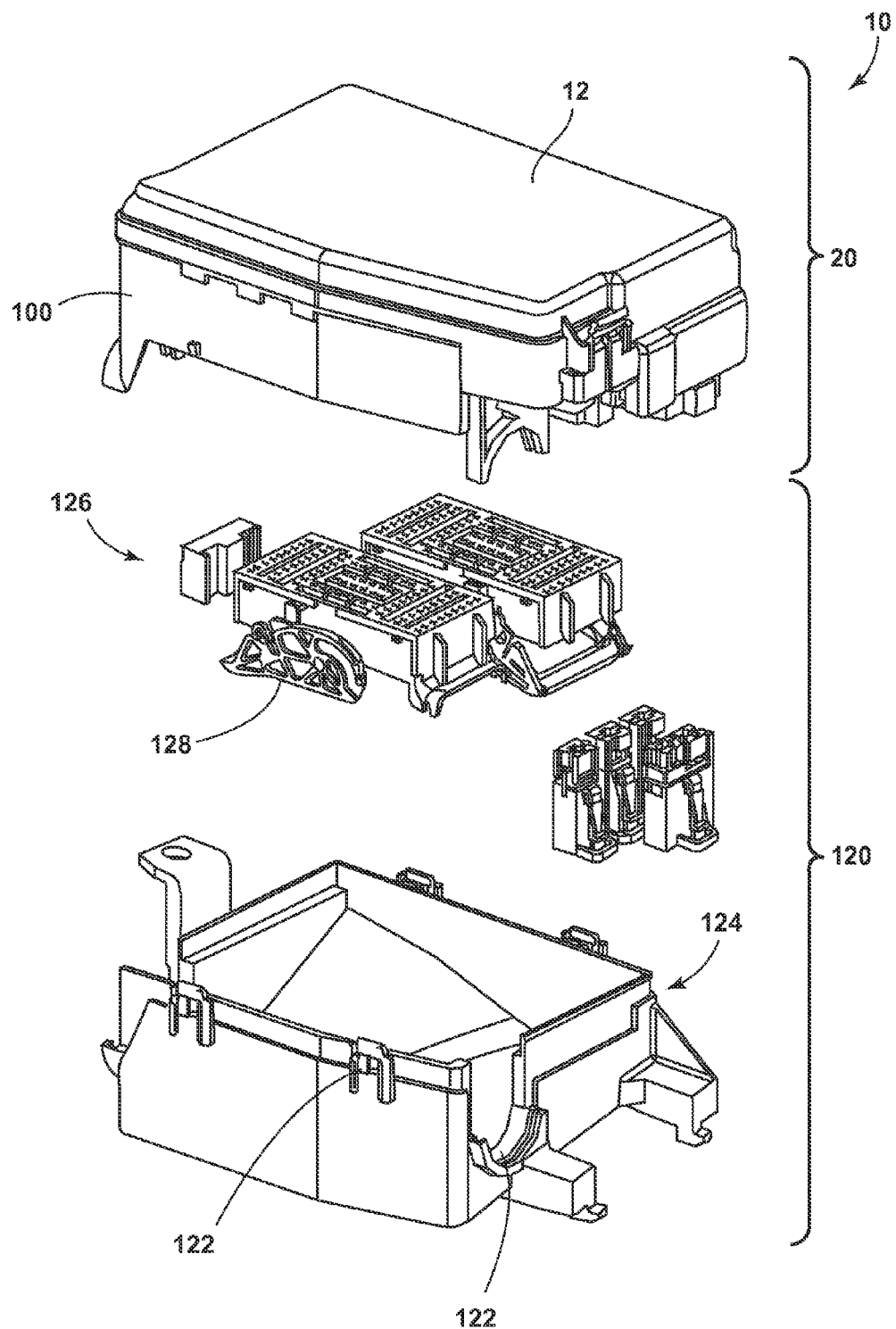
FIG. 5 is a exploded perspective view of embodiments of an upper level assembly and a lower level assembly according to teachings of the present disclosure.

In embodiments, power distribution box 10 may include a lower level assembly 120. As generally illustrated in FIG. 5, an embodiment of a lower level assembly 120 may include a bracket 122 and/or one or more connectors 126. As previously discussed, lower level assembly 120 may include one or more features 124, such as recesses, protrusions and/or apertures which may correspond to one or more features 106 of lower housing 100. For example, and without limitation, bracket 122 may include one or more protrusions 130 configured for connection or engagement (e.g., a snapping engagement) with one or more lower housing features 106.

As generally illustrated in FIG. 5, a bracket 122 may be configured to receive and/or support at least a portion of one or more connectors 126. Connectors 126 may be configured to be coupled to one or more electrical components 30, for example, and without limitation, fuses and/or relays. Connectors 126 may include one or more coupling features 128 configured to couple connectors 126 to each other (in embodiments with more than one connector 126), with bracket 122, and/or with upper level assembly 20. It should be understood that the one or more connectors 126 may comprise several shapes, sizes, orientations, and/or configurations, and are not limited to a particular embodiment.

Lower level assembly 120 may be configured to couple a power distribution box 10 to one or more surfaces. For example, and without limitation, bracket 122 may be configured to couple power distribution box 10 to a vehicle 14. Vehicle 14 may include a vehicle controller 18.

In embodiments, the power distribution box 10 may include at least one fastener 110 (for example, as generally illustrated in FIG. 4). Although a single fastener 110 may be described herein for simplicity, embodiments of a power distribution box 10 may comprise more than one fastener 110. Fastener 110, for example, and without limitation, may be configured to couple master fuse 50 to lower housing 100 and/or to PCB 70. Fastener 110 may comprise at least one material that may be metal and/or may be electrically conductive. Fastener 110 may comprise several different sizes and shapes and is not limited to any one shape or size. Fastener 110 may correspond to one or more apertures 56 in master fuse and/or PCB 70 and, for embodiments, may comprise an M8 stud.

Figure 6:
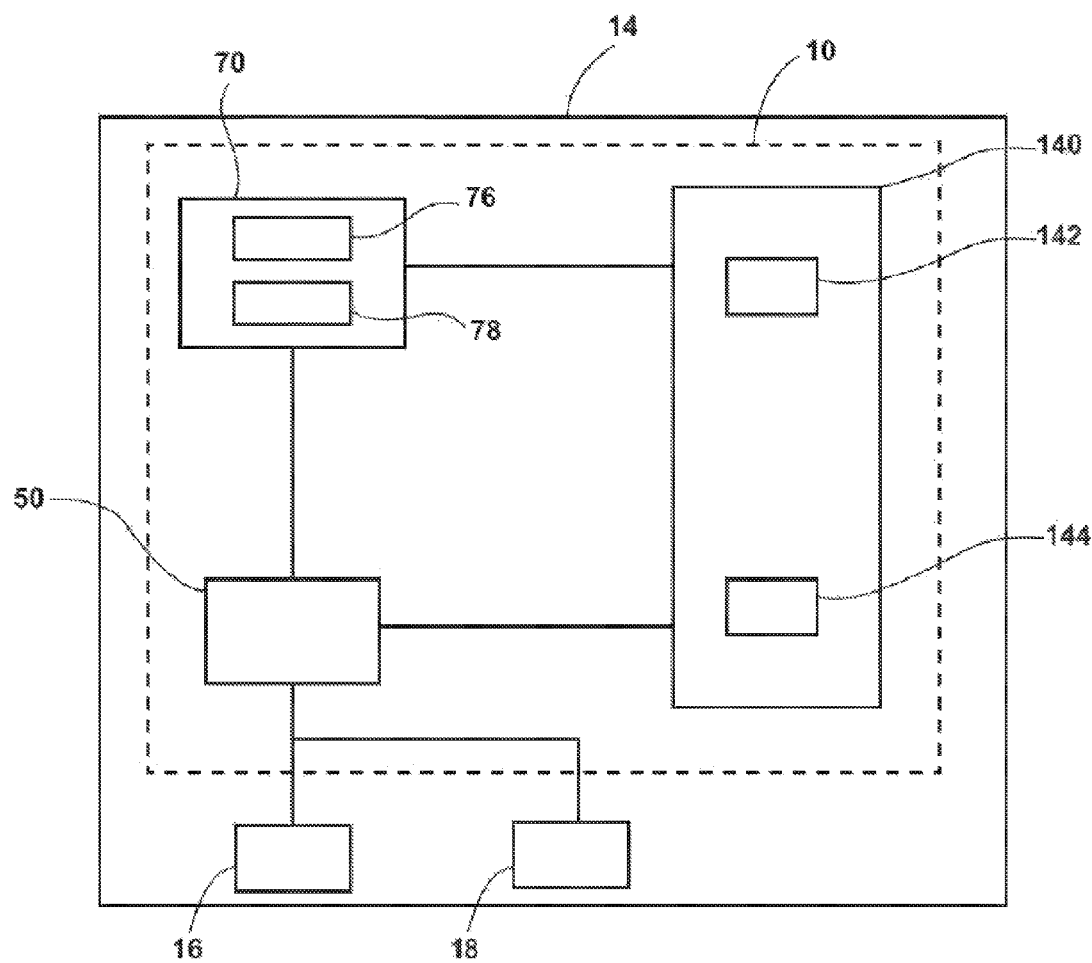
FIG. 6 is a schematic view of a vehicle comprising an embodiment of a power distribution box in accordance with teachings of the present disclosure.

As generally illustrated in FIG. 6, in embodiments, power distribution box may include one or more electronic controllers 140 configured to provide at least some intelligent functionality. Electronic controller 140 may comprise a programmable microprocessor and/or microcontroller, and may comprise an application specific integrated circuit (ASIC), for example Electronic controller 140 may include a central processing unit (CPU), memory, and/or an input/output (I/O) interface. Electronic controller 140 may be configured to perform various functions, such as those described in greater detail herein, and may include appropriate programming instructions or code embodied in software, hardware, and/or other medium.

In embodiments, electronic controller 140 may be configured to monitor and/or control electrical characteristics of PCB 70, electrical components 30, and/or master fuse 50. Electronic controller 140 may be connected to and/or communicate with vehicle controller 18.

In embodiments, electronic controller 140 may comprise a primary electronic controller 142 and/or a master fuse electronic controller 144. Primary electronic controller 142 may be configured to monitor and/or control electrical characteristics of primary PCB 76 and/or electrical characteristics of specific electrical components 30 coupled to primary PCB 76. For example, and without limitation, primary electronic controller 142 may monitor and/or control electrical current flowing to and/or from an electrical component 30.

Additionally or alternatively, and without limitation, a master fuse electronic controller 144 may be configured to monitor and/or control electrical characteristics of master fuse 50, which may include electrical characteristics of one or more high current fuses 60. Master fuse electronic controller 144 may, additionally or alternatively, be configured to monitor and/or control electrical characteristics of master fuse PCB 78. In some embodiments, primary electronic controller 142 and master fuse electronic controller 144 may be configured to collectively or independently monitor and/or control electrical characteristics of power distribution box 10.

The foregoing descriptions of specific embodiments of the present invention have been presented for purposes of illustration and description. They are not intended to be exhaustive or to limit the invention to the precise forms disclosed, and various modifications and variations are possible in light of the above teaching. It should be understood that references to a single element are also intended to include embodiments that may include more than one of that element or zero of that element. For example, references to at least one and/or one or more fuses are intended to include embodiments with one fuse or more than one fuse. Also, references to a fuse are not limited to a particular type of fuse and are intended to include any type of fuse or other component with similar functionality. The embodiments were chosen and described in order to explain the principles of the invention and its practical application, to thereby enable others skilled in the art to utilize the invention and various embodiments with various modifications as are suited to the particular use contemplated. It is intended that the scope of the invention be defined by the claims and their equivalents.

What is claimed is:

1. An integrated power distribution box comprising:
    an upper level assembly including:
        a printed circuit board comprising at least one electrical component;
        a lower housing configured to receive at least a portion of the printed circuit board;
        an intermediate housing configured to be coupled with at least one fuse;
        a master fuse electrically coupled to the printed circuit board;
        a printed circuit board bus bar that extends laterally outward from the printed circuit board for electrical coupling with the master fuse;
    at least one microprocessor electrically coupled to at least one of the master fuse and the printed circuit board; and
    a lower level assembly including at least one connector corresponding to at least one of the master fuse, the at least one electrical component, and the at least one fuse.

2. The integrated power distribution box of claim 1, wherein the master fuse includes a bus bar and at least one high current fuse coupled to the bus bar.

3. The integrated power distribution box of claim 2, wherein the at least one high current fuse comprises a plurality of high current fuses, wherein at least one of the plurality of high current fuses has a different current rating than another of the plurality of high current fuses.

4. The integrated power distribution box of claim 3, wherein at least one of the plurality of high current fuses is coupled to the bus bar via foxing.

5. The integrated power distribution box of claim 2, wherein the bus bar includes at least one coupling portion configured to couple the bus bar to the upper level assembly.

6. The integrated power distribution box of claim 5, wherein the at least one coupling portion comprises at least one of a snapping portion and an aperture.

7. The integrated power distribution box of claim 2, wherein the at least one high current fuse comprises a blade-type fuse.

8. The integrated power distribution box of claim 7, wherein the at least one high current fuse comprising the blade-type fuse includes a first blade-type fuse having a first blade size and a second blade-type fuse having a second blade size.

9. The integrated power distribution box of claim 2, wherein the at least one high current fuse includes a substantially perpendicular interface portion.

10. The integrated power distribution box of claim 1, wherein the at least one microprocessor comprises a master fuse microprocessor configured to at least one of monitor and control at least one electrical characteristic of the master fuse.

11. The integrated power distribution box of claim 10, wherein the at least one microprocessor includes a printed circuit board microprocessor configured to at least one of monitor and control at least one electrical characteristic of the at least one electrical component.

12. The integrated power distribution box of claim 11, wherein the master fuse microprocessor and the printed circuit board microprocessor are connected to each other and are configured to collectively at least one of monitor and control at least one electrical characteristic of the integrated power distribution box.

13. The integrated power distribution box of claim 1, wherein the at least one microprocessor comprises a printed circuit board microprocessor configured to at least one of monitor and control at least one electrical characteristic of the at least one electrical component.

14. The integrated power distribution box of claim 1, wherein the at least one microprocessor communicates with a vehicle controller.

15. The integrated power distribution box of claim 1, wherein the master fuse is coupled to the printed circuit board via an electrically conducting fastener.

16. The integrated power distribution box of claim 15, wherein the electrically conducting fastener comprises an 8 mm threaded stud.

17. The integrated power distribution box of claim 1, wherein the master fuse is coupled to the printed circuit board via at least one electrical terminal.

18. An integrated power distribution box comprising:
   an upper level assembly including:
      a printed circuit board comprising at least one electrical component;
      a lower housing configured to receive at least a portion of the printed circuit board;
      an intermediate housing configured to be coupled with at least one fuse;
      a master fuse electrically coupled to the printed circuit board;
   at least one microprocessor electrically coupled to at least one of the master fuse and the printed circuit board; and
   a lower level assembly including at least one connector corresponding to at least one of the master fuse, the at least one electrical component, and the at least one fuse
   wherein the master fuse includes a bus bar and at least one high current fuse coupled to the bits bar and the master fuse is coupled to the printed circuit board via welding the master fuse bus bar to a bus bar of the printed circuit board.

19. An integrated power distribution box comprising:
   an upper level assembly including:
      a printed circuit board comprising at least one electrical component;
      a lower housing configured to receive at least a portion of the printed circuit board;
      an intermediate housing configured to be coupled with at least one fuse;
      a master fuse electrically coupled to the printed circuit board;
   at least one microprocessor electrically coupled to at least one of the master fuse and the printed circuit board; and
   a lower level assembly including at least one connector corresponding to at least one of the master fuse, the at least one electrical component, and the at least one fuse
   wherein the at least one microprocessor is connected to a vehicle controller.

20. The integrated power distribution box of claim 19, further comprising a printed circuit board bus bar that extends laterally outward from the printed circuit board for electrical coupling with the master fuse.

* * * * *

UNITED STATES PATENT AND TRADEMARK OFFICE
CERTIFICATE OF CORRECTION

PATENT NO. : 9,265,164 B2  
APPLICATION NO. : 13/937880  
DATED : February 16, 2016  
INVENTOR(S) : Darr et al.

Page 1 of 1

It is certified that error appears in the above-identified patent and that said Letters Patent is hereby corrected as shown below:

In the Claims:

Column 6, line 26 (Claim 4), "foxing" should be --toxing--.

Signed and Sealed this
Seventeenth Day of May, 2016

Michelle K. Lee
*Director of the United States Patent and Trademark Office*